United States Patent
Häse et al.

(10) Patent No.: US 7,402,457 B2
(45) Date of Patent: Jul. 22, 2008

(54) METHOD FOR MAKING CONTACT WITH ELECTRICAL CONTACT WITH ELECTRICAL CONTACT SURFACES OF SUBSTRATE AND DEVICE WITH SUBSTRATE HAVING ELECTRICAL CONTACT SURFACES

(75) Inventors: Kerstin Häse, Ottobrunn (DE); Laurence Amigues, München (DE); Herbert Schwarzbauer, München (DE); Norbert Seliger, München (DE); Karl Weidner, München (DE); Jörg Zapf, München (DE); Matthias Rebhan, Riemerling (DE)

(73) Assignee: Siemens Aktiengesellschaft, Munich (DE)

( * ) Notice: Subject to any disclaimer, the term of this patent is extended or adjusted under 35 U.S.C. 154(b) by 224 days.

(21) Appl. No.: 10/491,137

(22) PCT Filed: Sep. 25, 2002

(86) PCT No.: PCT/DE02/03615

§ 371 (c)(1),
(2), (4) Date: Mar. 29, 2004

(87) PCT Pub. No.: WO03/030247

PCT Pub. Date: Apr. 10, 2003

(65) Prior Publication Data

US 2005/0032347 A1    Feb. 10, 2005

(30) Foreign Application Priority Data

Sep. 28, 2001   (DE) ................. 101 47 935

(51) Int. Cl.
*H01L 21/00*   (2006.01)

(52) U.S. Cl. ............. 438/106; 438/125; 438/126; 257/702; 257/701; 257/E23.116

(58) Field of Classification Search ............. 438/106, 438/125, 124, 126; 257/701, 702, 700
See application file for complete search history.

(56) References Cited

U.S. PATENT DOCUMENTS 5,049,980 A    9/1991   Saito et al.

(Continued)

FOREIGN PATENT DOCUMENTS

EP    0 987 760    3/2000

(Continued)

OTHER PUBLICATIONS

Harmann, G., "Wire Bonding in Microelectronics, Materials, Processes, Reliability and Yield", McGraw Hill 1998, pp. v-ix, 1-41, 281-290.

(Continued)

*Primary Examiner*—Zandra Smith
*Assistant Examiner*—Christy L Novacek
(74) *Attorney, Agent, or Firm*—Staas & Halsey LLP

(57) ABSTRACT

A film, based on polyimide or epoxy, is laminated onto a surface of a substrate under a vacuum, so that the film closely covers the surface and adheres thereto. Contact surfaces to be formed on the surface are uncovered by opening windows in the film. A contact is established in a plane manner between each uncovered contact surface and a layer of metal. This establishes a large-surface contact providing high current density for power semiconductor chips.

16 Claims, 2 Drawing Sheets

U.S. PATENT DOCUMENTS

| | | | |
|---|---|---|---|
| 5,291,066 | A | 3/1994 | Neugebauer et al. |
| 5,616,886 | A | 4/1997 | Romero et al. |
| 5,863,812 | A | 1/1999 | Manteghi |
| 6,239,980 | B1 * | 5/2001 | Fillion et al. ............... 361/760 |
| 6,294,741 | B1 | 9/2001 | Cole, Jr. et al. |
| 6,498,387 | B1 * | 12/2002 | Yang .......................... 257/620 |
| 2001/0004130 | A1 | 6/2001 | Higashi et al. |

FOREIGN PATENT DOCUMENTS

| | | | |
|---|---|---|---|
| WO | 01/37338 | | 5/2001 |
| WO | WO0163991 | * | 8/2001 |

OTHER PUBLICATIONS

Temple, V., "SPCO's ThinPak Package, an Ideal Block for Power Modules and Power Hybrids", IMAPS 99 Conference, Chicago 1999, pp. 642-646.

English Abstract for Published Japanese Patent Application 2000-252383, published Sep. 14, 2000.

English Abstract for Published Japanese Patent Application 11-087605, published Mar. 30, 1999.

English Abstract for Published Japanese Patent Application 11-176869, published Jul. 2, 1999.

English Abstract for Published Japanese Patent Application 06-090086, published Mar. 29, 1994.

Haque S., et al., "An Innovative Technique for Packaging Power Electronic Building Blocks Using Metal Posts Interconnected Parallel Plate Structures", IEEE Trans. Adv. Package, vol. 22, No. 2, May 1999, pp. 136-144.

Liu, X., et al., "Packaging of Integrated Power Electronics Modules Using Flip-Chip Technology", Applied Power Electronics Conference and Exposition, APEC '2000, pp. 290-296.

Gillot, C., et al., "A New Packaging Technique for Power Multichip Modules", IEEE Industry Applications Conference IAS '99, 1999, pp. 1765-1769.

Lu, G-Q., "3-D, Bond-Wireless Interconnection of Power Devices in Modules Will Cut Resistance, Parasitics and Noise", PCIM May 2000, pp. 40, 46-48, 65, 66, 68.

Krokoszinski, H.-U., Esrom, H., "Foil Clip for Power Module Interconnects", Hybrid Circuits 34, Sep. 1992, pp. 28-30.

* cited by examiner

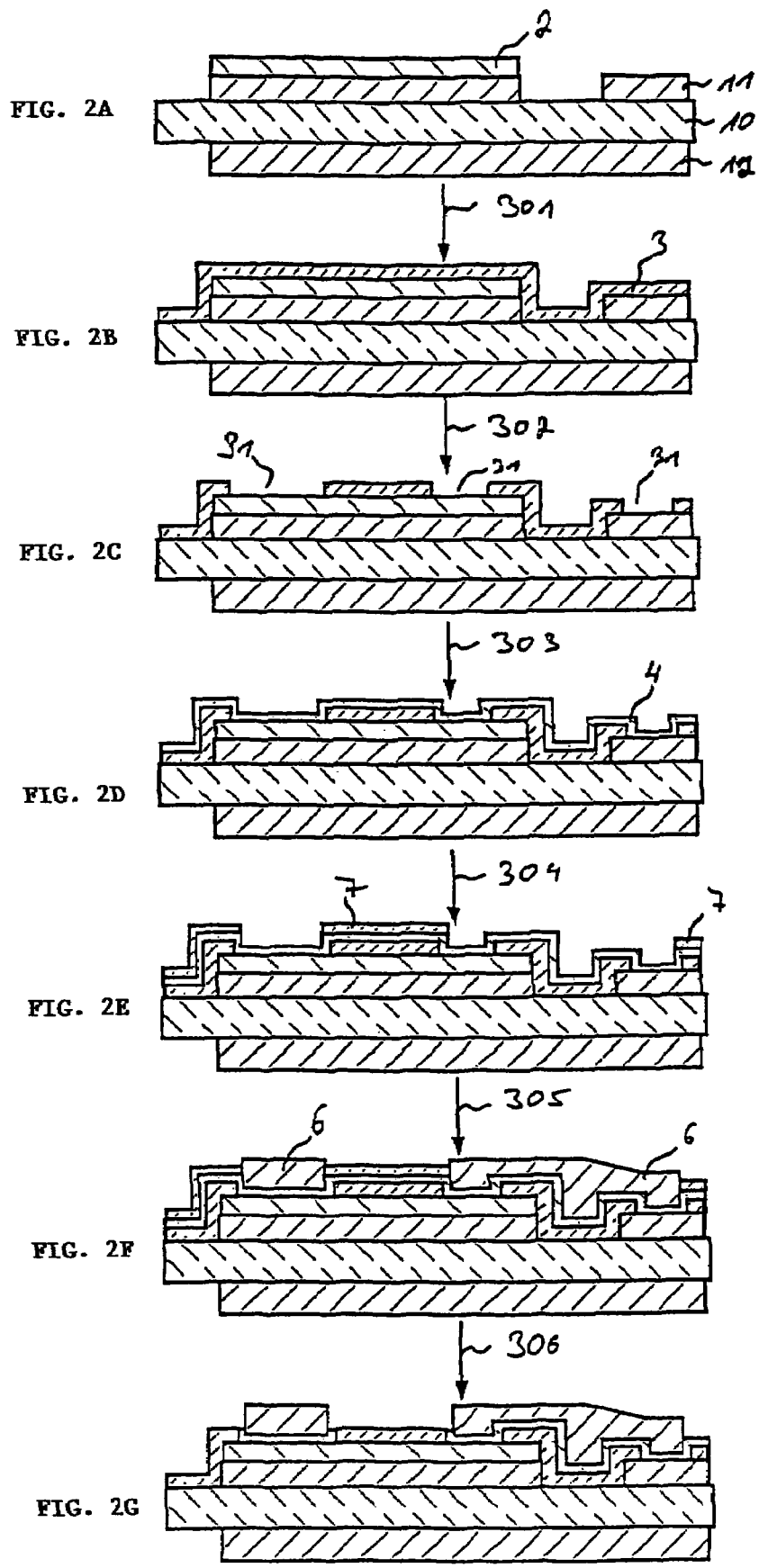

METHOD FOR MAKING CONTACT WITH ELECTRICAL CONTACT WITH ELECTRICAL CONTACT SURFACES OF SUBSTRATE AND DEVICE WITH SUBSTRATE HAVING ELECTRICAL CONTACT SURFACES

CROSS REFERENCE TO RELATED APPLICATIONS

This application is based on and hereby claims priority to German Application No. 101 47 935.2 filed on 28 Sep. 2001, the contents of which are hereby incorporated by reference.

BACKGROUND OF THE INVENTION

1. Field of the Invention

The invention relates to a method for making contact with one or more electrical contact surfaces on a surface of a substrate, and a device having a substrate with a surface on which electrical contact surfaces are arranged.

2. Description of the Related Art

The most widely established technology for interconnecting power semiconductor chips and connecting them to conductor tracks is thick-wire bonding (see Harmann, G., "Wire Bonding in Microelectronics, Materials, Processes, Reliability and Yield", Mc Graw Hill 1998). In this technique ultrasound energy is used to achieve a permanent connection between the Al wire, which has a typical diameter of several 100 µm, and the contact surface, which on the chip is an Al or Cu surface on the power module, via an intermetallic connection.

Other techniques have been published as alternatives to bonding, such as the ThinPak technique (see Temple, V., "SPCO's ThinPak Package, an Ideal Block for Power Modules and Power Hybrids", IMAPS 99 Conference, Chicago 1999). In this technique, contact is made with the chip surface via solder applied over holes in a ceramic plate.

In MPIPPS (Metal Posts Interconnected Parallel Plate Structures, see Haque S., et al., "An innovative Technique for Packaging Power Electronic Building Blocks Using Metal Posts Interconnected Parallel Plate Structures", IEEE Trans Adv. Pckag., Vol. 22, No. 2, May 1999), the contacts are made by soldered copper posts.

Another way of making contact is via solder bumps for flip-chip technology (Liu, X., et al., "Packaging of Integrated Power Electronics Modules Using Flip-Chip Technology", Applied Power Electronics Conference and Exposition, APEC '2000). This method additionally enables improved heat dissipation because the power semiconductors can be soldered onto DCB substrates on the upper and lower face (DCB stands for Direct Copper Bonding) (see Gillot, C., et al., "A New Packaging Technique for Power Multichip Modules", IEEE Industry Applications Conference IAS '99, 1999).

Making contact over a large area via vapor-deposited Cu leads is presented in (Lu, G.-Q., "3-D, Bond-Wireless Interconnection of Power Devices in Modules Will Cut Resistance, Parasitics and Noise", PCIM May 2000, pp. 40-68), wherein the conducting-track insulation (Power Module Overlay Structure) is fabricated by vapor-phase deposition (CVD technique).

Using a patterned foil to make contact via an adhesive or solder process was published in (Krokoszinski, H.-J., Esrom, H., "Foil Clip for Power Module Interconnects", Hybrid Circuits 34, September 1992).

U.S. Pat. No. 5,616,886 from Motorola proposes the bondless module without specifying any process details.

SUMMARY OF THE INVENTION

An object of the invention is to provide a method for making contact with one or more electrical contact surfaces on a surface of a substrate, which compared with traditional methods of such type has the particular advantage that it is possible to make contact over a large area, which allows a high current density.

Accordingly, a method provides a solution according to the invention for making contact with one or more electrical contact surfaces on a surface of a substrate, by doing the following:

Lamination under vacuum of a film made of electrically insulating plastic onto the surface of the substrate, so that the film covers with a tight fit the surface containing the contact surface or surfaces and adheres to this surface, Exposure of every contact surface to which contact is to be made contained on the surface by making respective windows in the film, and Making planar contact with every exposed contact surface by a layer made of electrically conducting material.

Any organic- or inorganic-based circuit carriers can be used as substrates, such as PCB (printed Circuit Board), DCB, IM (Insulated Metal), HTCC (High Temperature Cofired Ceramics) and LTCC (Low Temperature Cofired Ceramics) substrates.

Lamination is advantageously performed in a vacuum press, where vacuum forming, hydraulic vacuum compression, vacuum gas compression or similar lamination techniques are possible. The pressure is advantageously applied isostatically. Lamination is performed for example at temperatures of 100° C. to 250° C. and a pressure of 1 bar to 10 bar. The precise lamination process parameters, i.e. pressure, temperature, time etc. depend amongst other factors on the topology of the substrate, the plastic used for the film and the thickness of the film.

To make planar contact, it is advantageous to use physical or chemical deposition of the electrically conducting material. Physical techniques of this kind are sputtering and PVD (Physical Vapor Deposition). Chemical deposition can be performed from the vapor phase (Chemical Vapor Deposition, CVD) or liquid phase (Liquid Phase Chemical Vapor Deposition). It is also possible that a thin electrically conducting partial layer is applied by one of these techniques, and then a thicker electrically conducting partial layer is applied to this by electro-deposition.

Preferably and advantageously, in the method according to the invention a substrate is used having a surface populated with one or more semiconductor chips, in particular power semiconductor chips, on each of which are one or more contact surfaces to which contact is to be made, wherein the film is laminated onto this surface under vacuum, so that the film covers this surface including every semiconductor chip and every contact surface with a tight fit, and adheres to this surface including every semiconductor chip.

The film is designed here so that it can surmount a height difference of up to 500 µm. Reasons for the height difference include the substrate topology and the semiconductor chips arranged on the substrate.

The film can be made of any thermoplastic or duroplastic material or mixtures of these. In the method according to the invention, a film of at least one of a plastic based on polyimide (PI), polyethylene (PE), polyphenol, polyether ether ketone (PPEK) and epoxy can be used preferably and advantageously as the film, the surface of the film having an adhesive coating to improve adhesion.

The thickness of the film can equal 10 µm to 500 µm. Preferably and advantageously, a laminated film of thickness 25 to 150 µm is used in the method according to the invention.

After lamination, tempering is performed. Thermal treatment improves the adhesion of the film on the surface.

In a further embodiment, the lamination (with or without tempering) is repeated as many times as is necessary to achieve a certain thickness of the laminated film. For example, smaller-thickness films are made into a larger-thickness laminated film. These films are preferably made of a type of plastic. It is also possible for such films to be made of a plurality of different plastics. A layered, laminated film is obtained.

In a particular embodiment, a window is made in the film by laser ablation. A wavelength of a laser used for this purpose lies between 300 nm and 1100 nm. The power of the laser equals between 1 W and 100 W. For example, a $CO_2$ laser with a wavelength of 924 nm is used. In this process, the windows are made without damaging any aluminum chip contacts that may lie under the film.

In a further embodiment, a photosensitive film (photofilm) is used and a window is made by a photolithographic process. The photolithographic process involves exposing the photosensitive film, developing at least one of the exposed and unexposed areas of the film and removing the exposed or unexposed areas of the film.

After making the window, cleaning may be performed in which residues of the film are removed. The cleaning is performed by a wet-chemical process for example. In particular, a plasma cleaning technique is also possible.

In a further embodiment, a layer is used having a plurality of partial layers made of different electrically conducting material arranged one above the other. For instance different metal layers are applied on top of each other. The number of partial layers or metal layers equals in particular 2 to 5. A partial layer acting as a diffusion barrier can be integrated for example by the electrically conducting layer composed of a plurality of partial layers. Such a partial layer is made of a titanium-tungsten alloy for example (TiW). Advantageously, in a multi-layer structure, a partial layer providing or improving adhesion is applied directly to the surface to which contact is to be made. Such a partial layer is made of titanium for example.

In a particular embodiment, after the planar contact is made, at least one conductor track is made in and/or on the layer made of electrically conducting material. The conductor track can be applied to the layer. In particular, the layer is patterned to produce the conductor track. This means that the conductor track is formed in this layer. The conductor track is used, for example, to make electrical contact with a semiconductor chip.

Patterning is usually performed in a photolithographic process, in which a photoresist can be applied to the electrically conducting layer, dried and then exposed and developed. Sometimes this is followed by tempering to stabilize the applied photoresist for subsequent treatment processes. Traditional positive and negative resists (coating materials) can be used as photoresists. The photoresist is applied by a spraying or dipping process for example. Electro-deposition (electrostatic or electrophoretic deposition) is also possible.

Photosensitive films can also be used for patterning, which are laminated on, and exposed and developed in a similar way to the applied photoresist coating.

The conductor track can be produced as follows for example: in a first sub-step the electrically conducting layer is patterned and in a subsequent sub-step a further metallization is applied to the conductor track produced. The conductor track is reinforced by the additional metallization. For example, copper is applied by electro-deposition to the conductor track produced by patterning in a thickness of 1 µm to 400 µm. Then the photoresist layer or respectively the laminated film is removed. This is done using an organic solvent, an alkaline developer or the like for example. The planar, metallically conducting layer not reinforced with the metallization is removed again by subsequent differential etching. The reinforced conductor track is retained.

In a particular embodiment, the lamination, removal, contact making, and creation of conductor track are performed a number of times to fabricate a multi-layer device.

The invention advantageously provides a novel technology for making electrical contact and wiring up contact pads or contact surfaces arranged on semiconductor chips, in particular on power semiconductor chips. In addition, in the method according to the invention, the planar interface and the particular insulation result in a low-inductance connection to enable rapid and low-loss switching.

The lamination of the film under vacuum in the method according to the invention is given by an isostatic lamination. An electrical insulation layer is fabricated by the lamination of the film. The fabrication of the insulation layer by the lamination according to the invention provides the following advantages:

High-temperature use. A polyimide film can withstand up to 300° C. for instance.

Low process costs, e.g. in comparison with vapor-phase deposition of the insulator.

High dielectric field strengths are possible by using thick insulation layers.

High production rate, e.g. DCB substrates can be processed in the panel.

Homogeneous insulation properties, because air pockets are prevented by processing the film in the vacuum.

The whole chip contact surface can be used, allowing high currents to be diverted away. Chip contact surfaces of 60 $mm^2$ to 100 $mm^2$ can be realized.

The chips can be driven homogeneously because of the planar contacting.

The contact inductance for a contact surface is less than for thick-wire bonding owing to the planar geometry.

The contacting results in high reliability under vibration and mechanical shock stress.

Greater stress cycle endurance compared with competing methods because of lower thermo-mechanical stresses.

A plurality of wiring planes are accessible.

The described planar connection technology occupies a low overall height, resulting in a compact structure.

With multi-layer connecting planes, large-area metallization layers for screening can be realized. This is highly beneficial particularly for the EMC (electromagnetic compatibility) performance of the circuit (noise emission, noise immunity).

The invention also provides a device having a substrate having a surface on which are arranged electrical contact surfaces, wherein a film of electrically insulating material is laminated by vacuum onto the surface, fitting the surface tightly and adhering to the surface, the film having at every contact surface a window in which this contact surface is clear of film and is in planar contact with a layer of electrically conducting material.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIGS. 2A-2G are cross sections of the device providing an example of a method according to the invention.

DETAILED DESCRIPTION OF THE PREFERRED EMBODIMENT

Figure 1:
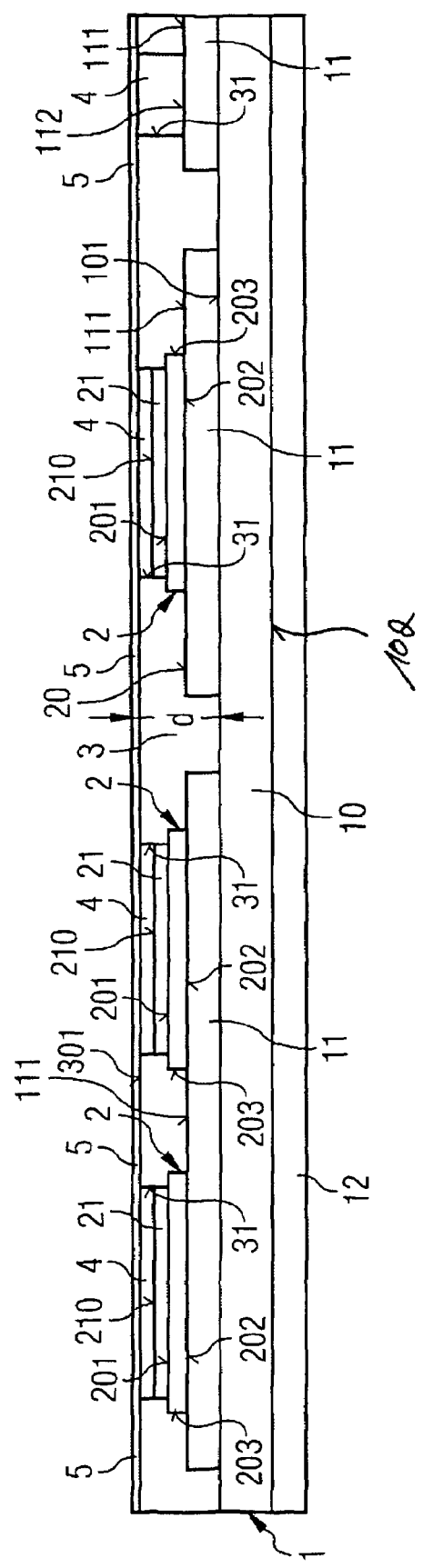
FIG. 1 is a vertical cross section through an example of a device according to the invention.

Reference will now be made in detail to the preferred embodiments of the present invention, examples of which are illustrated in the accompanying drawings, wherein like reference numerals refer to like elements throughout.

In FIG. 1, the substrate of the example is given the general label 1. This substrate 1 has a DCB substrate, for example, which as is known consists of a layer 10 made of ceramic material, a copper layer 12 applied to a lower surface 102 of the layer 10, and a copper layer 11 applied to a surface 101 of the layer 10 facing away from the lower surface 102.

Areas of the layer 11 on the upper surface 101 of the layer 10 are removed down to the upper surface 101, so that the upper surface 101 is exposed there, although this has no relevance to the invention.

Semiconductor chips 2, which may be identical to or different from each other, are applied to the surface 111 of the remaining copper layer 11 facing away from the layer 10.

Each semiconductor chip 2, which is preferably a power semiconductor chip, makes planar contact with the upper surface 111 of the layer 11 by a contact surface not shown, which exists on a lower surface 202 of the chip 2 facing the copper layer 11. For example, this contact surface is soldered to the layer 11.

On the upper surface 201 of each chip 2 facing away from the copper layer 11 and the lower surface 202, there is in each case a contact 21 having a contact surface 210 facing away from the chip 2.

If the semiconductor chip 2 is a transistor for example, the contact surface on the lower surface 202 of this chip 2 is the contact surface of a collector or drain contact, and the contact 21 on the upper surface 201 of the chip 2 is an emitter or source contact, whose contact surface is the contact surface 210.

The complete upper surface of the substrate 1 populated with the semiconductor chips 2 and given the general label 20 is given by the exposed parts of the upper surface 101 of the layer 10, the upper surface 111 of the copper layer 11 outside the chip 2 and by the exposed surface of each chip 2 itself defined by the upper surface 201 and the lateral surface 203 of this chip 2.

The surface 20 of the substrate 1 is the surface that is relevant to the invention.

According to the invention, a film 3 made of electrically insulating plastic is laminated under vacuum onto the surface 20 of the substrate 1, so that the film 3 covers with a tight fit the surface 20 containing the contact surfaces 210 and adheres to this surface 20 (FIG. 2, 301).

The laminated film 3 acts as insulator and as base for conductor tracks 5.

The film 3 is made of a polyimide- or epoxy-based plastic.

Tempering may follow for better adhesion. Typical thicknesses d of the film 3 lie in the range 25-150 μm, where larger thicknesses can also be achieved from a series of thinner layers of films 3. This advantageously enables dielectric field strengths in the kV region to be achieved.

Now each contact surface to which contact is to be made on the surface 20 of the substrate 1 is exposed by making respective windows 31 in the film 3 (FIG. 2, 302).

A contact surface to which contact is to be made is not just a contact surface 210 on a semiconductor chip 2, but may also be any area 112 of the upper surface 111 of the layer 11 made of copper or another metal that is exposed by making a window 31 in the film 3.

A window 31 is preferably made in the film 3 by laser ablation.

Subsequently, planar contact is made with every exposed contact surface 210 and 112 by a layer 4 made of electrically conducting material, preferably metal, by metallizing and patterning the exposed contact surfaces 210 and 112 using standard techniques and hence making planar contact (FIG. 2, 303).

For example, the layer 4 can be applied unselectively both to every contact surface 210 and 112 and to the upper surface 301 of the film 3 facing away from the surface 20 of the substrate 1, and then, for example, patterned by photolithography in such a way that every contact surface 210 and 112 remains in planar contact and conductor tracks 5 are formed outside the contact surfaces 210 and 112.

The following process is preferably performed (semiadditive construction):

i) Sputtering of a Ti adhesive layer of thickness about 100 nm and a Cu conducting layer 4 of thickness about 200 nm (FIG. 2, 303).

ii) Photolithography using thick resist layers or using photofilms 7 (FIG. 2, 304).

iii) Reinforcement of the exposed areas by electro-deposition of an electrically conducting layer 6. Layer thicknesses of up to 500 μm are possible here (FIG. 2, 305).

iv) Removal of resist layer and differential etching of Cu and Ti (FIG. 2, 306).

One can also proceed by applying a mask to the upper surface 301 of the film 3 facing away from the surface 20 of the substrate 1, the mask leaving exposed the contact surfaces 210 and 112 and the areas for the conductor tracks 5, and then applying the layer 4 made of the electrically conducting material unselectively to the mask and the contact surfaces 210 and 112 and to the areas left exposed by the mask. Then the mask is removed together with the layer 4 on top of it, so that all that remains are the contact surfaces 210 and 112 making planar contact and the conductor tracks 5 on the mask-free areas.

Either way results subsequently in a device having a substrate 1 having a surface 20 on which electrical contact surfaces 210, 112 are arranged, in which an insulator in the form of a film 3 made of electrically insulating material is laminated under vacuum on the surface 20, making a tight fit with the surface 20 and adhering to the surface 20, and in which the film 3 has a window at each contact surface 210 and 112 in which this contact surface 210 and 112 is clear of the film 3 and is in planar contact with a layer 4 and additionally with a layer 6 made of electrically conducting material. Special embodiments of this device follow from the above description.

The invention has been described in detail with particular reference to preferred embodiments thereof and examples, but it will be understood that variations and modifications can be effected within the spirit and scope of the invention.

The invention claimed is:

1. A method for making contact with at least one electrical contact surface on a surface of a substrate, comprising:

laminating under vacuum a film, made of electrically insulating plastic, onto the surface of the substrate the film covering and adhering to the surface of the substrate with a tight fit despite a variation in height as high as 500 μm;

forming at least one window in the film to expose each of the at least one electrical contact surface; and making planar contact with each of the at least one electrical contact surface by at least one layer made of electrically conducting material.

2. The method as claimed in claim 1, wherein the surface of the substrate is populated with at least one semiconductor chip, on each of which is at least one contact surface to which contact is to be made, and wherein said laminating produces the film covering and adhering to each semiconductor chip with a tight fit.

3. The method as claimed in claim 2, wherein each at least one semiconductor chip is a power semiconductor chip.

4. The method as claimed in claim 3, wherein the film is made of a plastic based on at least one of a polyimide, polyethylene, polyphenol, polyether ether ketone and epoxy.

5. The method as claimed in claim 4, wherein the film has a thickness of 25 μm to 150 μm.

6. The method as claimed in claim 5, further comprising tempering after said laminating of the film.

7. The method as claimed in claim 6, wherein said laminating is repeated as needed to obtain the thickness of 25 μm to 150 μm.

8. The method as claimed in claim 7, wherein said forming of the at least one window uses laser ablation.

9. The method as claimed in claim 8, wherein the film is photosensitive, and wherein said forming of the at least one window uses a photolithographic process.

10. The method as claimed in claim 9, wherein the at least one layer is a plurality of partial layers made of different electrically conducting material arranged one above another.

11. The method as claimed in claim 10, further comprising creating at least one conductor track at least one of in and on the layer of electrically conducting material after said making of the planar contact.

12. The method as claimed in claim 11, further comprising repeating said laminating, forming of the window, making of the planar contact, and creating of the conductor track to fabricate a multi-layer device.

13. A device, comprising:

a substrate having a surface on which are arranged electrical contact surfaces, and height differences of the surface being of up to 500 μm;

a film of electrically insulating material laminated by vacuum onto the surface, fitting the surface tightly and adhering to the surface despite the height difference as high as 500 μm, said film having windows corresponding to the electrical contact surfaces; and a layer of electrically conducting material in planar contact with the electrical contact surfaces through the windows in said film.

14. The device as claimed in claim 13, wherein said substrate includes at least one semiconductor chip, each having at least one of the electrical contact surfaces, said film fitting tightly against the at least one semiconductor chip and the at least one of the electrical contact surfaces corresponding to one of the windows in said film through which said layer of electrically conducting material is in planar contact with the at least one of the electrical contact surfaces.

15. The device as claimed in claim 14, wherein each of the at least one semiconductor chip is a power semiconductor chip.

16. A method for making contact with at least one electrically conducting layer of a plurality of layers, comprising:

depositing a plurality of layers directly on an upper surface of an insulating base layer, the layers including at least one electrically conducting layer, and covering partially the insulating base layer and other layers of the plurality of layers;

laminating a film covering and adhering tightly to upper surfaces of different layers of the plurality of layers having a variation in height as high as 500 μm, and an exposed portion of the insulating base layer, and preventing planarization;

forming at least one window in the film to expose an upper surface of each of the at least one electrically conducting layer; and making a planar contact with the exposed upper surface of each of the at least one electrically conducting layer.

* * * * *